United States Patent
Wada et al.

(10) Patent No.: US 9,576,941 B2
(45) Date of Patent: Feb. 21, 2017

(54) LIGHT-EMITTING DEVICE AND METHOD OF MANUFACTURING THE SAME

(71) Applicant: TOYODA GOSEI CO., LTD., Kiyosu-shi (JP)

(72) Inventors: Satoshi Wada, Kiyosu (JP); Aya Kawaoka, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 30 days.

(21) Appl. No.: 14/599,308

(22) Filed: Jan. 16, 2015

(65) Prior Publication Data
US 2015/0204494 A1    Jul. 23, 2015

(30) Foreign Application Priority Data

Jan. 21, 2014    (JP) .................................. 2014-008811

(51) Int. Cl.
*H01L 33/00* (2010.01)
*H01L 25/075* (2006.01)
(Continued)

(52) U.S. Cl.
CPC ........... *H01L 25/0753* (2013.01); *H01L 24/83* (2013.01); *H01L 24/95* (2013.01); *H01L 33/505* (2013.01); *H01L 33/507* (2013.01); *H01L 33/60* (2013.01)

(58) Field of Classification Search
CPC ...... H01L 25/0753; H01L 24/95; H01L 24/83; H01L 33/505; H01L 33/60; H01L 33/507
See application file for complete search history.

(56) References Cited

U.S. PATENT DOCUMENTS 3,901,996 A  *  8/1975  Hasegawa ............... C03C 3/321
                                                              427/399
7,842,526 B2 * 11/2010 Hadame .................. H01L 24/97
                                                              257/E33.068
(Continued)

FOREIGN PATENT DOCUMENTS

JP    2007-019096 A    1/2007
JP    2011-134829 A    7/2011
(Continued)

OTHER PUBLICATIONS

Japanese Office Action dated Dec. 6, 2016, in JPA No. 2014-008811, with JPO Computer Generated English translation thereof.

*Primary Examiner* — Donald Raleigh
(74) *Attorney, Agent, or Firm* — McGinn IP Law Group, PLLC.

(57) ABSTRACT

A light-emitting device includes a plurality of light-emitting elements face-down mounted on a substrate, a plurality of structures each including a transparent plate, a phosphor-containing film provided on a lower surface of the transparent plate and a transparent covering layer provided on the lower surface of the transparent plate so as to cover lower and side surfaces of the phosphor-containing film, the structures being each provided on each of the plurality of light-emitting elements such that a lower surface of the transparent covering layer contacts a top surface of the plurality of light-emitting elements, and a white reflector to cover a side surface of the plurality of light-emitting elements and a side surfaces of the transparent covering layer. At least a portion of a region directly above a gap between the plurality of light-emitting elements is not covered with the phosphor-containing film.

18 Claims, 7 Drawing Sheets

(51) Int. Cl.
*H01L 23/00* (2006.01)
*H01L 33/50* (2010.01)
*H01L 33/60* (2010.01)

(56) References Cited

U.S. PATENT DOCUMENTS

| | | | |
|---|---|---|---|
| 2009/0206352 A1* | 8/2009 | Becker | H01L 33/505 257/98 |
| 2010/0155764 A1* | 6/2010 | Serita | H01L 33/56 257/98 |
| 2010/0320479 A1 | 12/2010 | Minato et al. | |
| 2011/0001148 A1* | 1/2011 | Sun | H01L 33/60 257/88 |
| 2011/0266560 A1* | 11/2011 | Yao | H01L 33/0079 257/88 |
| 2011/0303940 A1 | 12/2011 | Lee et al. | |
| 2012/0126274 A1* | 5/2012 | Jagt | C08K 3/0008 257/98 |
| 2013/0001605 A1 | 1/2013 | Ishihara et al. | |
| 2014/0131753 A1* | 5/2014 | Ishida | H01L 25/0753 257/98 |
| 2015/0041841 A1* | 2/2015 | Basin | C09K 11/02 257/98 |
| 2015/0171290 A1 | 6/2015 | Lee et al. | |
| 2015/0316215 A1* | 11/2015 | Togawa | H01L 25/0753 362/231 |

FOREIGN PATENT DOCUMENTS

| | | |
|---|---|---|
| JP | 2012-004567 A | 1/2012 |
| JP | 2013-016588 A | 1/2013 |
| WO | WO 2009-069671 A1 | 6/2009 |
| WO | WO 2013144777 A1 * 10/2013 | ............. C09K 11/02 |

* cited by examiner

LIGHT-EMITTING DEVICE AND METHOD OF MANUFACTURING THE SAME

The present application is based on Japanese patent application No. 2014-008811 filed on Jan. 21, 2014, the entire contents of which are incorporated herein by reference.

BACKGROUND OF THE INVENTION

1. Field of the Invention

The invention relates to a light-emitting device and a method of manufacturing the light-emitting device.

2. Description of the Related Art

A light-emitting device is known which has a phosphor layer with a phosphor included therein and in which the side surface of a light-emitting element is covered with a light-reflecting member (see, e.g., JP-A-2007-19096, WO 2009/069671 and JP-A-2011-134829). In the light-emitting device, light laterally emitted from the light-emitting element is reflected by the light-reflecting member so as to improve luminance.

JP-A-2007-19096 discloses a light-emitting device in which a flip-chip mounted LED element, except a light-extracting surface, is covered with a coating material including light-reflecting particles and a phosphor layer in the form of sheet is provided on the light-extracting surface of the LED element.

WO 2009/069671 and JP-A-2011-134829 disclose a light-emitting device in which a plate-shaped light transmissive member including a phosphor is provided on plural flip-chip mounted light-emitting elements and the side surface of the light-emitting elements and the light transmissive member is covered with a covering member including a light reflecting material.

SUMMARY OF THE INVENTION

The light-emitting devices disclosed in JP-A-2007-19096, WO 2009/069671 and JP-A-2011-134829 are constructed such that a region around the light-emitting element and directly above the light-reflecting member is covered with a layer including the phosphor. Since the amount of light directly inputted from the light-emitting elements is low in a region of the layer including the phosphor directly above the light-reflecting member, light emitted from the region has a large proportion of fluorescence and chromaticity is different from that in light emitted from other regions. Thus, a problem may arise that the difference in emission chromaticity between different regions is visually recognized as color unevenness.

In addition, the light-emitting devices disclosed in JP-A-2007-19096, WO 2009/069671 and JP-A-2011-134829 may cause a problem that the contact area between the phosphor layer and the light-reflecting member is large and the thermal expansion or heat deterioration of the light-reflecting member is likely to occur due to heat released from the phosphor layer. The thermal expansion and heat deterioration of the light-reflecting member may cause the deformation or malfunction of the light-emitting device so as to lower the reliability.

It is an object of the invention to provide a light-emitting device that offers a high reliability, a high brightness and a high color evenness even when provided with the phosphor layer, as well as a method of manufacturing the light-emitting device.

(1) According to one embodiment of the invention, a light-emitting device comprises:

a plurality of light-emitting elements face-down mounted on a substrate;

a plurality of structures each comprising a transparent plate, a phosphor-containing film provided on a lower surface of the transparent plate and a transparent covering layer provided on the lower surface of the transparent plate so as to cover lower and side surfaces of the phosphor-containing film, the structures being each provided on each of the plurality of light-emitting elements such that a lower surface of the transparent covering layer contacts a top surface of the plurality of light-emitting elements; and a white reflector to cover a side surface of the plurality of light-emitting elements and a side surfaces of the transparent covering layer, wherein at least a portion of a region directly above a gap between the plurality of light-emitting elements is not covered with the phosphor-containing film.

In the above embodiment (1) of the invention, the following modifications and changes can be made.

(i) The transparent covering layer comprises a low-melting-point glass layer.

(ii) The phosphor-containing film comprises ceramics containing phosphor particles.

(iii) The phosphor-containing film is not more than 50 μm in thickness.

(iv) The transparent covering layer is in thickness not more than 10 μm from the lower surface of the phosphor-containing film.

(v) The region directly above the gap between the plurality of light-emitting elements is not covered with the phosphor-containing film.

(2) According to another embodiment of the invention, a method of manufacturing a light-emitting device comprises:

forming structures each comprising a transparent plate, a phosphor-containing film formed on a surface of the transparent plate and a transparent covering layer formed on the surface of the transparent plate so as to cover a surface of the phosphor-containing film;

heating and adhering the transparent covering layer to a top surface of a plurality of light-emitting elements face-down mounted on a substrate so as to bond each of the structures onto each of the light-emitting elements; and covering with a white reflector a side surface of the plurality of light-emitting elements and a side surface of the transparent covering layer, wherein at least a portion of a region directly above a gap between the plurality of light-emitting elements is not covered with the phosphor-containing film.

In the above embodiment (2) of the invention, the following modifications and changes can be made.

(vi) The phosphor-containing film is formed by applying and sintering a liquid precursor containing ceramic powder mixed with phosphor particles on the surface of the transparent plate.

(vii) The transparent covering layer comprises a low-melting-point glass layer.

(viii) The transparent covering layer is formed by applying a liquid precursor containing powder of low-melting-point glass to the transparent plate so as to cover the surface of the phosphor-containing film and then melting the precursor by heating to not less than a melting point of the low-melting-point glass.

(ix) The transparent covering layer is formed by dipping the transparent plate having the phosphor-containing film on the surface into a low-melting-point glass melt such that a melt of the low-melting-point glass is applied to all surfaces of the transparent plate and the phosphor-containing film, and then curing the melt.

(x) The region directly above the gap between the plurality of light-emitting elements is not covered with the phosphor-containing film.

Effects of the Invention

According to one embodiment of the invention, a light-emitting device can be provided that offers a high reliability, a high brightness and a high color evenness even when provided with the phosphor layer, as well as a method of manufacturing the light-emitting device.

BRIEF DESCRIPTION OF THE DRAWINGS

Next, the present invention will be explained in more detail in conjunction with appended drawings, wherein.

DETAILED DESCRIPTION OF THE PREFERRED EMBODIMENT

Embodiment

Figure 1:
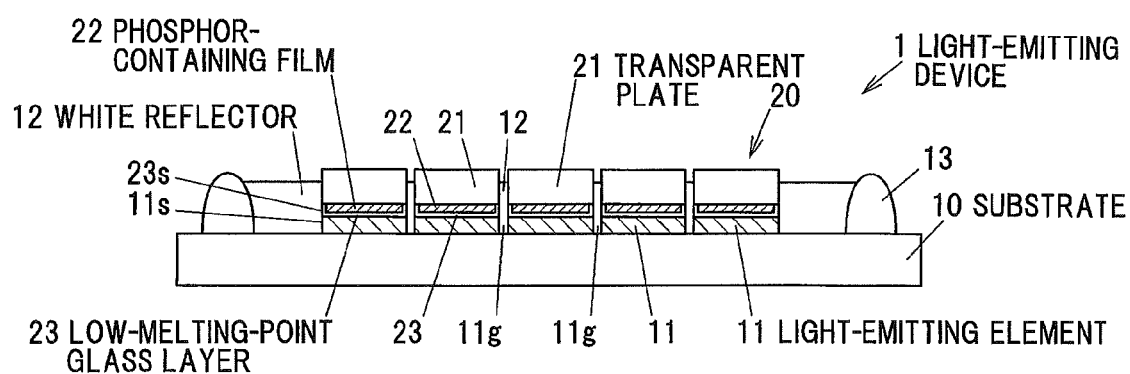
FIG. 1 is a vertical cross-sectional view showing a light-emitting device in an embodiment.
Figure 2A:
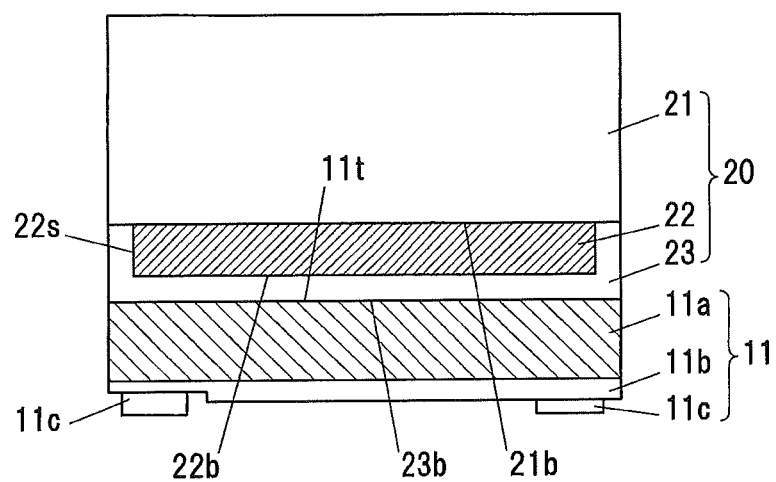
FIG. 2A is a vertical cross-sectional view showing a light-emitting element and a structure included in the light-emitting device in the embodiment.
Figure 2B:
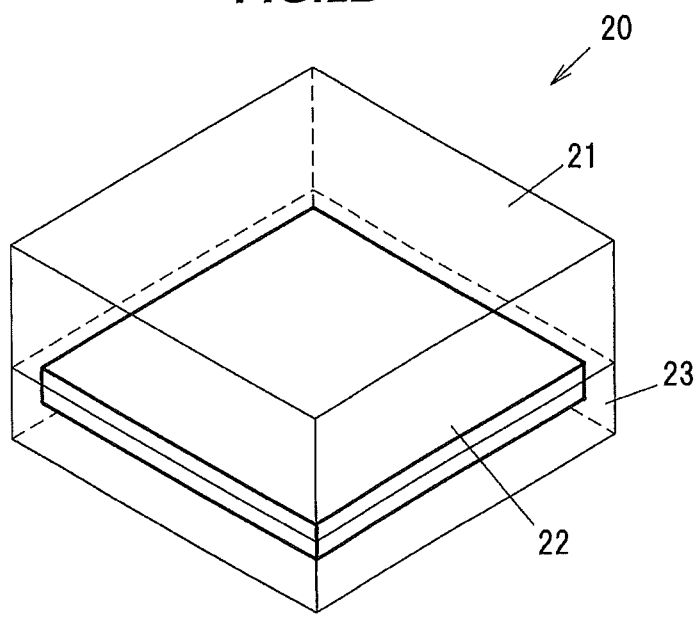
FIG. 2B is a perspective view showing the structure.

FIG. 1 is a vertical cross-sectional view showing a light-emitting device 1 in the embodiment. FIG. 2A is a vertical cross-sectional view showing a light-emitting element 11 and a structure 20 of the light-emitting device 1. FIG. 2B is a perspective view showing the structure 20.

The light-emitting device 1 has plural light-emitting elements 11 face-down mounted on a substrate 10, plural structures 20 provided, one each, on the plural light-emitting elements 11, and a white reflector 12 surrounding the plural light-emitting elements 11 and the plural structures 20.

The structure 20 includes a transparent plate 21, a phosphor-containing film 22 provided on a lower surface 21b of the transparent plate 21, and a low-melting-point glass layer 23 also provided on the lower surface 21b of the transparent plate 21 so as to cover a lower surface 22b and side surfaces 22s of the phosphor-containing film 22.

The structures 20 are provided, one each, on the plural light-emitting elements 11 so that lower surfaces 23b of the low-melting-point glass layers 23 are in contact with top surfaces 11t of the plural light-emitting elements 11.

The white reflector 12 covers side surfaces 11s of the plural light-emitting elements 11 and side surfaces 23s of the low-melting-point glass layers 23. In the example shown in FIGS. 2A and 2B, a region immediately above gaps 11g is not covered with the phosphor-containing film 22 since the area of the phosphor-containing film 22 is smaller than the area of the light-emitting element 11.

Figure 3:
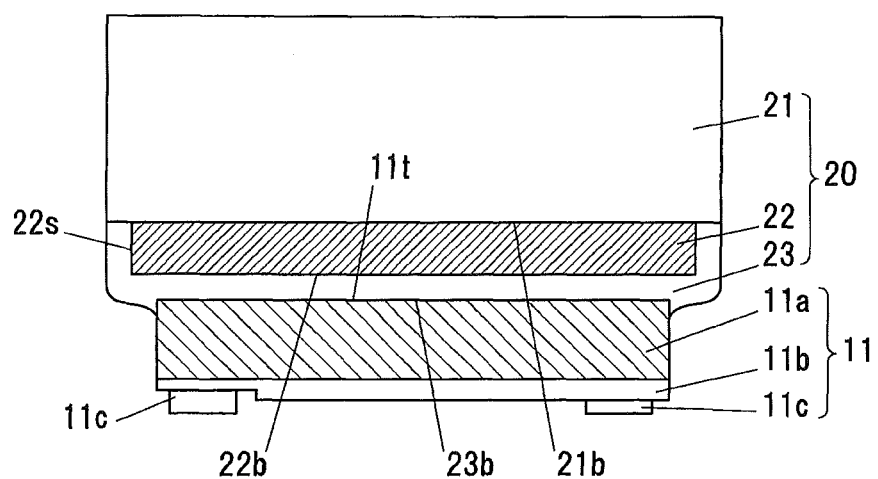
FIG. 3 is a vertical cross-sectional view showing the light-emitting element and the structure when the area of the phosphor-containing film is larger than that of the light-emitting element.

FIG. 3 is a vertical cross-sectional view showing the light-emitting element 11 and the structure 20 when the area of the phosphor-containing film 22 is larger than that of the light-emitting element 11. Even in this case, at least a portion of the region immediately above gaps 11g is not covered with the phosphor-containing film 22.

Since the white reflector 12 is formed to cover the side surfaces 11s of the light-emitting elements 11 and the side surfaces 23s of the low-melting-point glass layer 23, light laterally emitted from the light-emitting elements 11 and the phosphor-containing films 22 is reflected by the white reflector 12 and this improves light extraction efficiency of the light-emitting device 1.

The substrate 10 is formed of, e.g., AlN. The substrate 10 is a substrate having wirings (not shown) and is, e.g., a wiring substrate having a wiring pattern on a surface or a lead frame inserted board.

The light-emitting element 11 is an LED chip having a chip substrate 11a and a crystal layer 11b which has cladding layers and a light-emitting layer sandwiched therebetween, as shown in FIG. 2A. Alternatively, a light-emitting element other than the LED chip, such as laser diode may be used. The chip substrate 11a is, e.g., a sapphire substrate or a GaN substrate.

Since the light-emitting element 11 is face-down mounted, e.g., flip-chip mounted, the crystal layer 11b is located on the lower side and the chip substrate 11a is located on the upper side. Therefore, the top surface of the chip substrate 11a serves as the top surface 11t of the light-emitting element 11 to be in contact with the lower surface 23b of the low-melting-point glass layer 23. Electrodes 11c are respectively connected to n-type and p-type layers of the crystal layer 11b and the light-emitting element 11 is connected to a wiring portion of the substrate 10 via the electrodes 11c.

Roughening the top surface 11t (the surface in contact with the low-melting-point glass layer 23) of the chip substrate 11a of the face-down mounted light-emitting element 11 increases a bonding area between the light-emitting element 11 and the low-melting-point glass layer 23 and thereby improves an adhesive force, and also reduces a distance between the phosphor-containing film 22 and the light-emitting element 11. In addition, total reflection of light by the top surface of the chip substrate 11a is also reduced and it is thereby possible to improve light extraction efficiency.

The transparent plate 21 is formed of a transparent material such as glass, sapphire or resin. By using a material with low thermal conductivity (W/(m·K)) for the transparent plate 21, deterioration of the white reflector 12 caused by the elevated temperature of the transparent plate 21 is suppressed and reliability of the light-emitting device 1 is thus improved.

In addition, light emitted from the light-emitting element 11 and escaping to the outside without passing through the phosphor-containing film 22 can be reduced by roughening the surface of the transparent plate 21, adding a light-scattering material or providing a covering layer containing a scattering material, thereby further reducing unevenness in emission color of the light-emitting device 1. As the light-scattering material, it is possible to use a material having a different refractive index from that of the transparent plate 21, e.g., titanium oxide.

The phosphor-containing film 22 is formed of, e.g., ceramics such as alumina containing phosphor particles, glass containing phosphor particles or resin containing phosphor particles. Since ceramics have better heat resistance and light resistance than resin, ceramics containing phosphor particles are particularly preferable as a material of the phosphor-containing film 22. For forming the phosphor-containing film 22 using ceramics containing phosphor particles, for example, an ink containing a mixture of YAG phosphor particles and alumina powder is applied and sintered on a surface of the transparent plate 21.

The thickness of the phosphor-containing film 22 is preferably not more than 50 μm. When the thickness of the phosphor-containing film 22 is increased, the phosphor particle concentration is reduced to maintain emission chromaticity. However, if the phosphor-containing film 22 is thicker than 50 μm, the reduced phosphor particle concentration causes a decrease in thermal conductivity and this adversely affects emission characteristics. In addition, the reduced phosphor particle concentration also causes uneven distribution of phosphor particles and unevenness in emission color is more likely to occur.

In addition, the grain size of phosphor particles is preferably small in order to reduce the uneven distribution of phosphor particles. The grain size of phosphor particles is preferably, e.g., not more than 15 μm, more preferably, not more than 5 μm.

The phosphor particles contained in the phosphor-containing film 22 absorb energy of light emitted from the light-emitting element 11 and emit fluorescence. A color of light emitted from the light-emitting element 11 and exiting to the outside through the phosphor-containing film 22 is mixed with a color of fluorescence emitted from the phosphor particles and the resulting mixed color is the emission color of the light-emitting device 1. When, for example, the emission color of the light-emitting element 11 is blue and the fluorescent color of the phosphor particles contained in the phosphor-containing film 22 is yellow, the emission color of the light-emitting device 1 is white.

The low-melting-point glass layer 23 is a transparent layer formed of low-melting-point glass. The thickness of the low-melting-point glass layer 23 is preferably not more than 10 μm, more preferably 1 to 2 μm, from the lower surface 22*b* of the phosphor-containing film 22 from the viewpoint of heat dissipation.

A dam 13 is formed of, e.g., resin, metal, ceramics or glass, etc. In the light-emitting device 1, the dam 13 does not need to have light reflectivity since the white reflector 12 is provided.

The white reflector 12 is formed of, e.g., resin such as silicone resin or epoxy resin containing white pigment such as titanium oxide, or low-melting-point glass. Alternatively, the material of the white reflector 12 may be low-melting-point glass containing white pigment such as titanium oxide. Separation of the low-melting-point glass layer 23 due to linear expansion of the white reflector 12 can be prevented by forming the white reflector 12 using the same material as the low-melting-point glass layer 23. In addition, by using a highly heat-resistant material for the white reflector 12, deterioration of the white reflector 12 caused by heat generation of the phosphor-containing film 22 can be suppressed more effectively.

Figure 4:
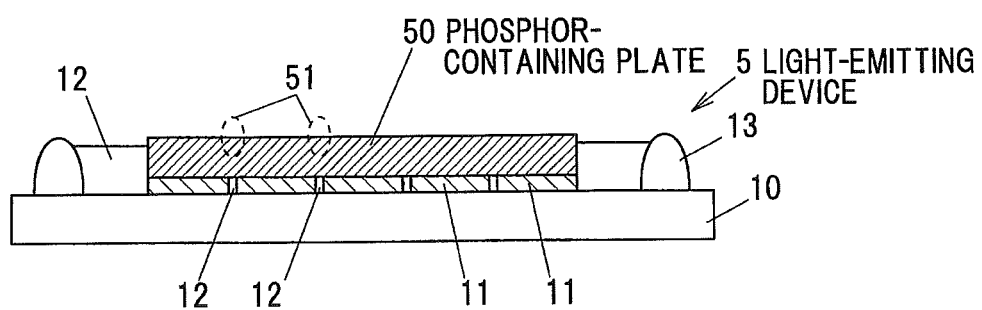
FIG. 4 is a vertical cross-sectional view showing a light-emitting device in Comparative Example.

FIG. 4 is a vertical cross-sectional view showing a light-emitting device 5 in Comparative Example. The light-emitting device 5 has a plate-shaped phosphor-containing plate 50 in place of the phosphor-containing film 22 and the low-melting-point glass layer 23 of the light-emitting device 1. The phosphor-containing plate 50 is formed of, e.g., transparent resin or glass containing phosphor particles, or a single crystal phosphor, etc.

In the light-emitting device 5, the region immediately above the gaps between the plural light-emitting elements 11 is entirely covered with the phosphor-containing plate 50. Since the amount of light directly inputted from the light-emitting elements 11 is low in regions 51 of the phosphor-containing plate 50 directly above the white reflector 12, light emitted from the regions 51 has a large proportion of fluorescence and chromaticity is different from that of light emitted from other regions. In detail, when, for example, the emission color of the light-emitting elements 11 is blue and the fluorescent color of the phosphor-containing plate 50 is yellow, yellow color in light emitted from the region 51 is stronger than in light emitted from other regions. Thus, there is a possibility that such a difference in emission chromaticity between different regions is visually recognized as color unevenness in the light-emitting device 5.

In the light-emitting device 1, on the other hand, unevenness in emission color is suppressed since at least a portion of the region immediately above the white reflector 12 provided in the gaps 11*g* between the plural light-emitting elements 11 is not covered with the phosphor-containing film 22.

In addition, since the phosphor-containing film 22 is not in contact with the white reflector 12 unlike the phosphor-containing plate 50, thermal expansion of the white reflector 12 due to heat generated by phosphor is small and damages such as cracks, etc., on the white reflector 12 due to heat deterioration can be also suppressed. Meanwhile, in the transparent plate 21 and the low-melting-point glass layer 23, phosphor as a heat source is not contained and heat is thus not generated during operation of the light-emitting device 1. Also, temperature of the transparent plate 21 is not elevated by heat generated in the phosphor-containing film 22 since a low thermal conductivity material is used as a material of the transparent plate 21. Therefore, deterioration of the white reflector 12 when formed of resin is suppressed.

In addition, the phosphor-containing film 22 of the light-emitting device 1 is significantly thinner than the phosphor-containing plate 50 of the light-emitting device 5. Therefore, even when the base material of the phosphor-containing film 22 is a resin, etc., with low thermal conductivity, a heat propagation distance in the base material is short and thermal resistance is thus small. The heat generated by the phosphor particles is then efficiently dissipated through the light-emitting element 11. Thus, it is possible to suppress heat deterioration of the peripheral members such as the white reflector 12. In addition, the low thermal resistance of the phosphor-containing film 22 allows heat from the phosphor particles to be efficiently reduced, which improves luminous efficacy and luminous flux of the light-emitting device 1. In the phosphor-containing plate 50 which is thick and thus has high thermal resistance, temperature is elevated at a portion distant from the light-emitting element 11 which serves as a heat-dissipation portion and the peripheral members is thereby likely to be deteriorated.

In addition, unlike the phosphor-containing plate 50 of the light-emitting device 5, the structures 20 of the light-emitting device 1 are provided, one each, on the plural phosphor-containing films 22. Therefore, even when the plural light-emitting elements 11 mounted on the substrate 10 are uneven in height, a distance between the light-emitting element 11 and the structure 20 can be highly uniform and it is possible to suppress variation in emission chromaticity of each light-emitting element 11 resulting from variation in thickness of the low-melting-point glass layer 23. In addition, variation in heat dissipation of each region resulting from variation in thickness of the low-melting-point glass layer 23 is also reduced and this allows unevenness in emission color due to variation in temperature to be suppressed.

In addition, horizontal light propagation which occurs in the phosphor-containing plate 50 as a single plate can be reduced since the structures 20 are plural divided pieces. This allows light extraction efficiency of the light-emitting device 1 to be improved.

Process of Manufacturing the Light-Emitting Device

An example of a manufacturing process of the light-emitting device 1 will be described below.

Figure 5A:
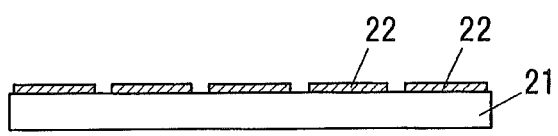
FIGS. 5A to 5C are vertical cross-sectional views showing a manufacturing process of the structure of the light-emitting device in the embodiment.
Figure 5B:
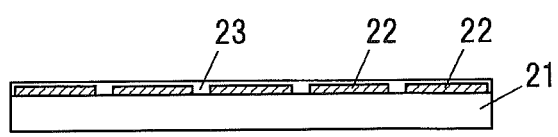
Figure 5C:
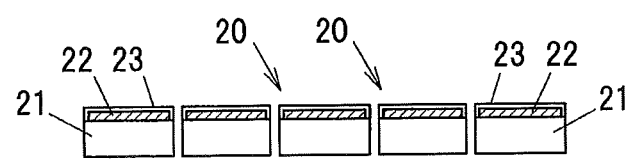

FIGS. 5A to 5C are vertical cross-sectional views showing a manufacturing process of the structure 20 of the light-emitting device 1 in the embodiment.

Firstly, as shown in FIG. 5A, a liquid precursor of the phosphor-containing film 22, e.g., an ink containing ceramic powder mixed with phosphor particles, etc., is applied to a surface of the transparent plate 21 by screen printing, spin coating or electrostatic coating, etc., and is then sintered, thereby forming the plural phosphor-containing films 22. When using spin coating or electrostatic coating, for example, a liquid precursor of the phosphor-containing film 22 is applied and sintered on the entire surface of the transparent plate 21 and is then patterned using photolithography. Alternatively, patterning to form the phosphor-containing films 22 may be performed by lift-off process using a photoresist.

Next, as shown in FIG. 5B, a liquid precursor formed by mixing powder (or pellets) of low-melting-point glass with a solvent is applied to the transparent plate 21 by screen printing, spin coating or electrostatic coating, etc., so as to cover the surfaces of the phosphor-containing films 22 and is melted by heating to the melting point or more of the low-melting-point glass, thereby forming the low-melting-point glass layer 23.

Next, as shown in FIG. 5C, the transparent plate 21 having the phosphor-containing films 22 and the low-melting-point glass layer 23 on the surface thereof is divided, thereby obtaining plural structures 20.

Figure 6A:
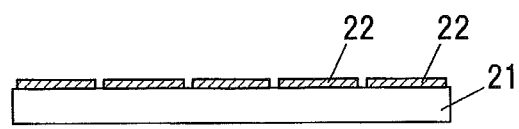
FIGS. 6A to 6C are vertical cross-sectional views showing a modification of the manufacturing process of the structure of the light-emitting device in the embodiment.
Figure 6B:
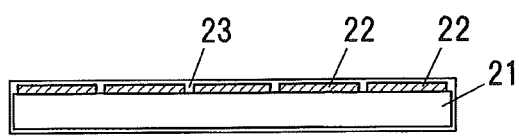
Figure 6C:
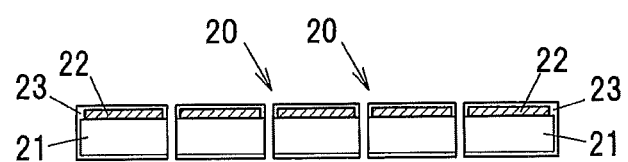

FIGS. 6A to 6C are vertical cross-sectional views showing a modification of the manufacturing process of the structure 20 of the light-emitting device 1 in the embodiment.

Firstly, as shown in FIG. 6A, a liquid precursor of the phosphor-containing film 22 is applied and sintered on the surface of the transparent plate 21, thereby forming the phosphor-containing films 22.

Next, as shown in FIG. 6B, the transparent plate 21 having the phosphor-containing films 22 on the surface thereof is dipped into a low-melting-point glass melt (dip coating) so that the low-melting-point glass melt is applied to the all surfaces of the transparent plate 21 and the phosphor-containing films 22, and the melt is then cured, thereby forming the low-melting-point glass layer 23.

Next, as shown in FIG. 6C, the transparent plate 21 having the phosphor-containing films 22 and the low-melting-point glass layer 23 on the surface thereof is divided, thereby obtaining plural structures 20.

In this method, on the transparent plate 21, the low-melting-point glass layer 23 is formed also on a surface which is to be a light-extracting surface and does not have the phosphor-containing film 22 thereon. Low-melting-point glass has a lower refractive index (e.g., 1.5 to 1.58) than that of sapphire. Therefore, when the transparent plate 21 is formed of sapphire, escape cone can be increased by preventing Fresnel reflection and it is thus possible to improve light extraction efficiency.

FIGS. 7A to 7E are vertical cross-sectional views showing a manufacturing process of the light-emitting device 1 in the embodiment.

Figure 7A:
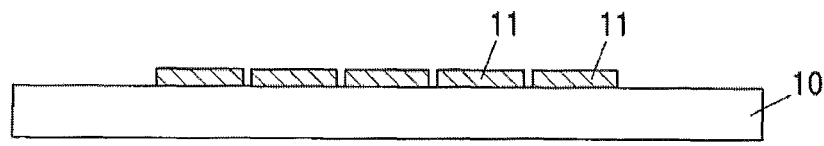
FIGS. 7A to 7E are vertical cross-sectional views showing a manufacturing process of the light-emitting device in the embodiment.

Firstly, the plural light-emitting elements 11 are face-down mounted on the substrate 10, as shown in FIG. 7A.

Figure 7B:
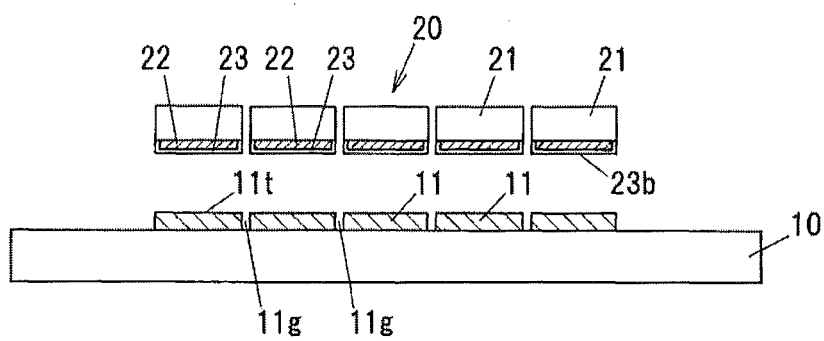
Figure 7C:
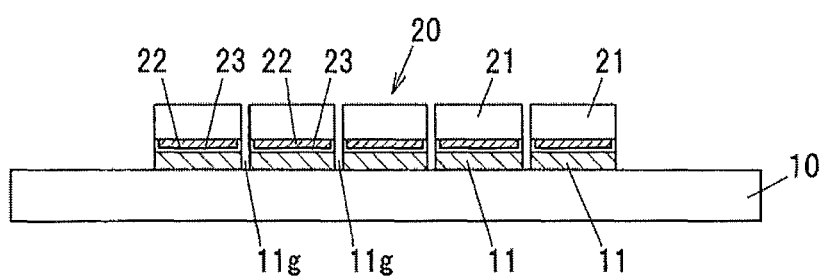

Next, as shown in FIGS. 7B and 7C, the structures 20 are adhered to the plural light-emitting elements 11 on the substrate 10 using the low-melting-point glass layer 23 as an adhesive layer. The structures 20 are bonded to the light-emitting elements 11 by heating in a state that the top surfaces 11$t$ of the light-emitting elements 11 are in contact with the lower surfaces 23$b$ of the low-melting-point glass layers 23.

At this time, the light-emitting elements 11 and the structures 20 are bonded so that at least a portion of the region immediately above the gaps 11$g$ between the plural light-emitting elements 11 is not covered with the phosphor-containing films 22.

Figure 7D:
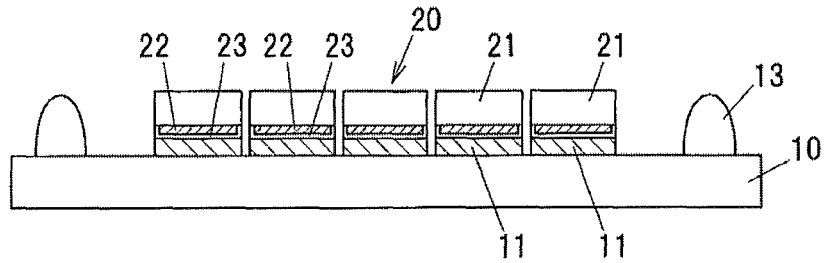

Next, as shown in FIG. 7D, the dam 13 surrounding the plural light-emitting elements 11 is formed on the substrate 10. The dam 13 is formed by, e.g., dripping a liquid white resin in an annular shape on the substrate 10 and then curing the resin.

Figure 7E:
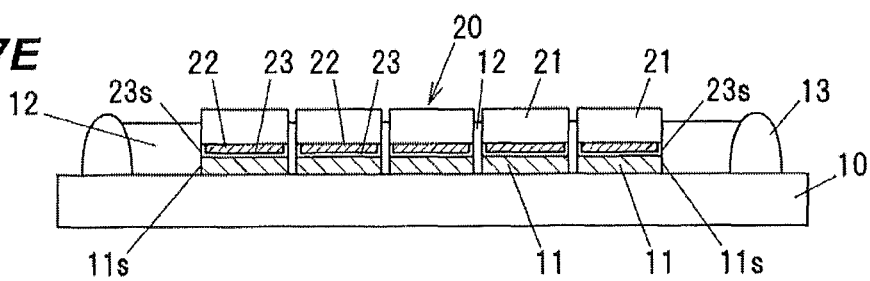

Next, as shown in FIG. 7E, the white reflector 12 is provided to fill the inside of the dam 13. The white reflector 12 is formed by, e.g., dripping a liquid white resin to fill the inside of the dam 13 and then curing the resin.

The white reflector 12 is provided to cover the side surfaces 11$s$ of the plural light-emitting elements 11 and the side surfaces 23$s$ of the low-melting-point glass layers 23. The white reflector 12 also fills the gaps 11$g$ between the plural light-emitting elements 11. Upper surfaces of the transparent plates 21, which are light-extracting surfaces, are not covered with the white reflector 12.

Effects of the Embodiment

In the embodiment, the phosphor-containing films 22 formed on the transparent plates 21 are used as a phosphor layer and the white reflector 12 is provided to surround the light-emitting elements 11 as well as the structures 20, thereby allowing a high-intensity light-emitting device 1 with less color unevenness to be obtained.

In addition, thermal expansion or heat deterioration of the white reflector 12 caused by heat generated by the phosphor-containing film 22 is suppressed by covering the phosphor-containing film 22 with the low-melting-point glass layer 23, which allows reliability of the light-emitting device 1 to be increased.

Although the embodiment of the invention has been described, the invention is not intended to be limited to the embodiment and the various kinds of modifications can be implemented without departing from the gist of the invention.

For example, a layer formed of a material other than low-melting-point glass, e.g., a transparent layer formed of an organic material such as thermosetting resin or thermoplastic resin, may be used instead of the low-melting-point glass layer 23. A method of forming a layer formed of such organic materials and a method of adhering such a layer to the light-emitting elements 11 are the same as those of the low-melting-point glass layer 23. Use of low-melting-point glass is most preferable from the viewpoint of heat resistance, while an organic material having a low melting point is preferable from the viewpoint of processability. Among organic materials, a thermosetting resin which is not softened by heat generated during operation of the light-emitting device 1 is preferably used. Here, the low-melting-point glass layer 23 and layers applicable as an alternative of the low-melting-point glass layer 23 are collectively called "a transparent covering layer".

In addition, the invention according to claims is not to be limited to the embodiment. Further, all combinations of the features described in the embodiment are not necessary to solve the problem of the invention.

What is claimed is:

1. A light-emitting device, comprising:
   a plurality of light-emitting elements face-down mounted on a substrate;
   a plurality of structures, each of the plurality of structures comprising:
      a transparent plate;
      a phosphor-containing film provided on a lower surface of the transparent plate; and
      a transparent covering layer provided on the lower surface of the transparent plate so as to cover lower and side surfaces of the phosphor-containing film, the structures being each provided on each of the plurality of light-emitting elements such that a lower surface of the transparent covering layer contacts a top surface of the plurality of light-emitting elements; and
   a white reflector to cover a side surface of the plurality of light-emitting elements and a side surfaces of the transparent covering layer,
   wherein at least a portion of a region directly above a gap between the plurality of light-emitting elements is not covered with the phosphor-containing film, and
   wherein a width of the phosphor-containing film is less than a width of the transparent plate.

2. The light-emitting device according to claim 1, wherein the transparent covering layer comprises a low-melting-point glass layer.

3. The light-emitting device according to claim 1, wherein the phosphor-containing film comprises ceramics containing phosphor particles.

4. The light-emitting device according to claim 1, wherein the phosphor-containing film is not more than 50 μm in thickness.

5. The light-emitting device according to claim 1, wherein the transparent covering layer is in thickness not more than 10 μm from the lower surface of the phosphor-containing film.

6. The light-emitting device according to claim 1, wherein the region directly above the gap between the plurality of light-emitting elements is not covered with the phosphor-containing film.

7. The light-emitting device according to claim 1, wherein a surface area of the lower surface of the transparent plate is greater than a surface area of the top surface of the plurality of light-emitting elements.

8. The light-emitting device according to claim 1, wherein a surface area of the lower surface of the transparent plate and a surface area of a lower surface of the phosphor-containing film are each greater than a surface area of the top surface of the plurality of light-emitting elements.

9. The light-emitting device according to claim 1, wherein the transparent covering layer contacts the lower surface of the transparent plate.

10. The light-emitting device according to claim 1, wherein the transparent covering layer entirely surrounds the phosphor-containing film such that the phosphor-containing film is not in contact with the white reflector.

11. The light-emitting device according to claim 1, wherein the white reflector is separated from the phosphor-containing film in a width direction of the substrate via the transparent covering layer.

12. The light-emitting device according to claim 1, wherein a distance between the phosphor-containing film and a light-emitting element of the corresponding structure varies in a width direction of the structure.

13. A method of manufacturing a light-emitting device, comprising:
    forming structures, each of the structures comprising:
       a transparent plate;
       a phosphor-containing film formed on a surface of the transparent plate; and
       a transparent covering layer formed on the surface of the transparent plate so as to cover a surface of the phosphor-containing film;
    heating and adhering the transparent covering layer to a top surface of a plurality of light-emitting elements face-down mounted on a substrate so as to bond each of the structures onto each of the light-emitting elements; and
    covering with a white reflector a side surface of the plurality of light-emitting elements and a side surface of the transparent covering layer,
    wherein at least a portion of a region directly above a gap between the plurality of light-emitting elements is not covered with the phosphor-containing film, and
    wherein a width of the phosphor-containing film is less than a width of the transparent plate.

14. The method according to claim 13, wherein the phosphor-containing film is formed by applying and sintering a liquid precursor containing ceramic powder mixed with phosphor particles on the surface of the transparent plate.

15. The method according to claim 13, wherein the transparent covering layer comprises a low-melting-point glass layer.

16. The method according to claim 15, wherein the transparent covering layer is formed by applying a liquid precursor containing powder of low-melting-point glass to the transparent plate so as to cover the surface of the phosphor-containing film and then melting the precursor by heating to not less than a melting point of the low-melting-point glass.

17. The method according to claim 15, wherein the transparent covering layer is formed by dipping the transparent plate having the phosphor-containing film on the surface into a low-melting-point glass melt such that a melt of the low-melting-point glass is applied to all surfaces of the transparent plate and the phosphor-containing film, and then curing the melt.

18. The method according to claim 13, wherein the region directly above the gap between the plurality of light-emitting elements is not covered with the phosphor-containing film.

* * * * *